United States Patent [19]
Ketelhohn et al.

[11] Patent Number: 5,176,158
[45] Date of Patent: Jan. 5, 1993

[54] APPARATUS AND METHOD FOR TRANSPORTING MATERIALS WHICH ARE TO BE CHEMICALLY TREATED

[75] Inventors: Karl F. G. Ketelhohn; Randall E. Markle, both of State College; James J. Ash, Centre Hall, all of Pa.

[73] Assignee: Chemcut Corporation, State College, Pa.

[21] Appl. No.: 783,940

[22] Filed: Oct. 29, 1991

[51] Int. Cl.⁵ ............................................. B08B 1/02
[52] U.S. Cl. .................................... 134/32; 134/151; 134/902; 198/836.2
[58] Field of Search ............... 198/446, 721, 780, 791, 198/836.2; 134/131, 151, 153, 902, 32

[56] References Cited

U.S. PATENT DOCUMENTS

| | | | |
|---|---|---|---|
| 2,941,650 | 6/1960 | Clinton | 198/446 |
| 3,082,774 | 3/1963 | Benton et al. | |
| 3,431,921 | 3/1969 | Pesek | |
| 4,015,706 | 4/1977 | Goffredo et al. | 198/791 |
| 4,042,100 | 8/1977 | Morrone | 198/446 |
| 4,173,276 | 11/1979 | Raudat et al. | 198/446 |
| 4,370,921 | 2/1983 | Moller et al. | 198/721 |
| 4,781,205 | 11/1988 | Shakley | |
| 5,002,616 | 3/1991 | Ketelhohn | 134/22 |

FOREIGN PATENT DOCUMENTS

| | | |
|---|---|---|
| 2851510 | 7/1979 | Fed. Rep. of Germany |
| 8911779 | 11/1989 | PCT Int'l Appl. |
| 1210143 | 10/1970 | United Kingdom |

Primary Examiner—Joseph E. Valenza
Attorney, Agent, or Firm—Paul & Paul

[57] ABSTRACT

An apparatus and method is disclosed for transporting thin materials, such as printed circuit boards or films, in an etching or other chemical treatment operation whereby a series of guide members, such as wires, which move back and forth in a reciprocating manner, guide the articles being transported through the apparatus and facilitate generally uniform treatment coverage of the articles with a treatment fluid.

25 Claims, 3 Drawing Sheets

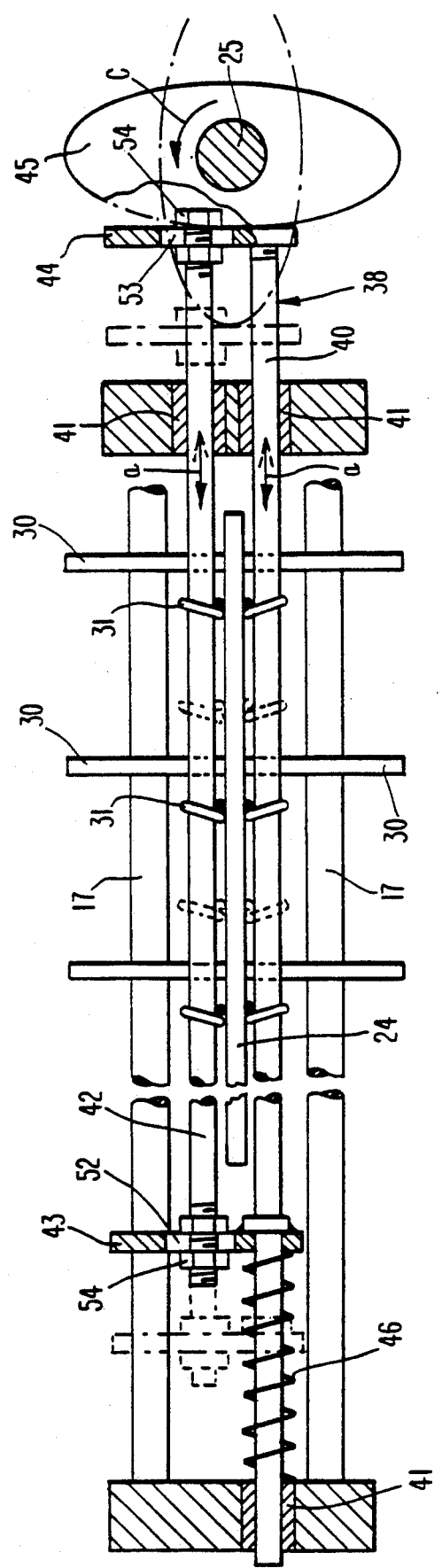
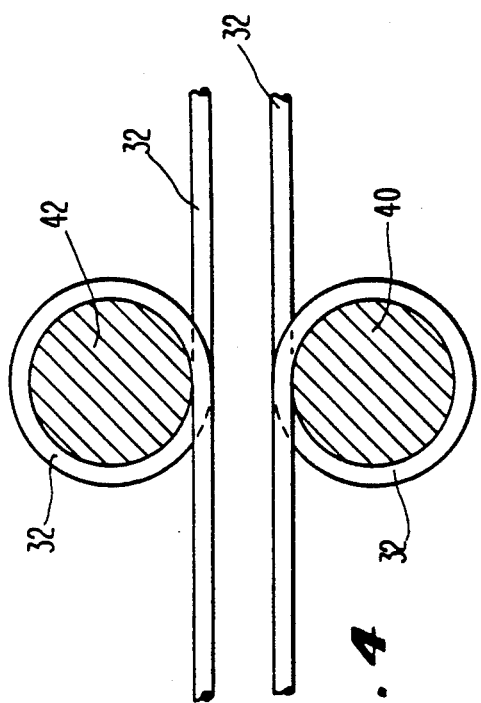
Fig. 3
Fig. 4

APPARATUS AND METHOD FOR TRANSPORTING MATERIALS WHICH ARE TO BE CHEMICALLY TREATED

BACKGROUND OF THE INVENTION

1. Field of the Invention

The present invention relates to an apparatus and method for chemically treating thin materials.

2. Description of the Prior Art

In the electronics industry, the art has developed progressively thinner printed circuit boards to the extent that the rigid or semi-rigid printed boards have become increasingly thinner and approach or become more of a flexible film. The processing of such "boards", which can more precisely resemble films, presents new concerns in the handling of these articles, as the thin materials have a tendency to buckle and cause jamming of the treatment or processing apparatus. Attempts to deal with this generation of printed boards have relied on providing additional supports to retain the film in place as it travels through a processing apparatus or treatment center. For example, additional bands or wires running the length of an apparatus have been employed in the transport areas for support to prevent jamming of the films against or under the drive rods which move the articles through the machine. However, the presence of stationary wires running the length of the apparatus, often tend to prevent the etchant spray or other treatment fluid from reaching the board area covered by the wire. This results in an undesirable masking or shadow effect, and does not provide a uniform etch or other treatment. Attempts to deal with this problem have largely been to use an arrangement of several fixedly disposed bands at staggered positions along the transport means and as in U.S. Pat. No. 4,781,205.

SUMMARY OF THE INVENTION

The present invention is directed toward providing an apparatus and method which utilize movable guide means for supporting thin materials as they are transported through the apparatus. The moving guide means facilitates generally uniform treatment of a circuit board or film with an etchant or other chemical fluid which is being applied to the board.

It is a primary object of the present invention to provide movable guide means for supporting thin materials traveling through a treatment operation which permit uniform chemical treatment of the materials.

It is a further object of the present invention to provide guide means which are laterally shifted as articles are transported through the apparatus.

It is an additional object of the present invention to accomplish the above objects wherein a series of elongate members are attached to a movable common element which moves the elongate members along therewith.

It is another object of the present invention to accomplish any of the above objects where the chemical treatment includes delivering a spray of treatment fluid to the thin materials as they are being moved through the apparatus.

Other objects and advantages of the present invention will be readily apparent to those skilled in the art from a reading of the following brief descriptions of the drawing figures, the detailed descriptions of the preferred embodiments, and the appended claims.

BRIEF DESCRIPTION OF THE DRAWINGS

FIG. 3 is an enlarged fragmentary transverse sectional view taken generally along the line 3—3 of FIG. 1 showing an article being transported through the apparatus, with upper and lower guide member movement between full line and phantom positions being indicated by the direction of the double arrows.

FIG. 4 is an enlarged fragmentary sectional view of the portion of the apparatus represented by the zone 4 of FIG. 2 showing the wrap of the guide members around the movable rod members.

DETAILED DESCRIPTION OF THE PREFERRED EMBODIMENTS

Figure 1:
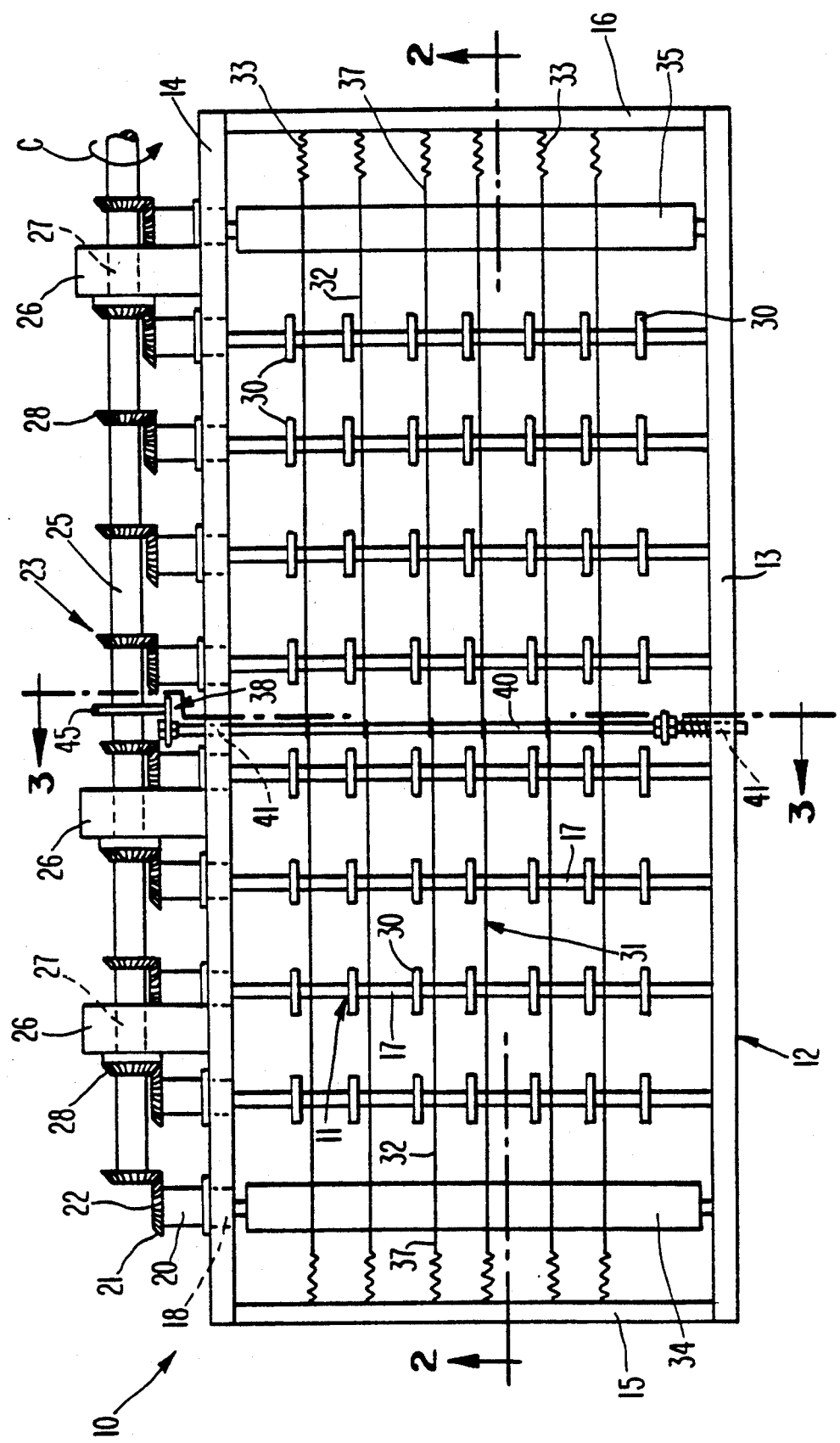
FIG. 1 is a top view of an apparatus showing a transport means with the wire support means, the section being taken in a horizontal plane of the apparatus in which the articles are to travel, and generally along the line 1—1 of FIG. 2.

Referring now to the drawings in detail, reference is first made to FIG. 1, which shows an apparatus, generally designated by the numeral 10, comprising first transport means 11. It is noted that the apparatus 10 may be further part of a larger apparatus assembly (not shown) comprising a series of additional treatment or processing stations. A frame 12 which supports the transport means 11 is shown having a pair of oppositely disposed longitudinal wall portions 13, 14 connected by opposing transverse wall portions 15, 16.

The first transport means 11 is shown for example comprising a series of rotatably mounted transverse transport rods 17 which extend between longitudinal frame wall portions 13 and 14. While not shown, it is understood that any suitable mounting means which permits rotation of the rods 17 may be employed to maintain one end of each rod 17 in position on frame wall portion 13. Each rod 17 is shown supported, at its opposite end, by a bearing member 18 which is disposed within frame wall portion 14. The rods 17 extend through the frame wall 14 and are each ultimately connected to a bevel gear 20. The bevel gear 20 is fixedly mounted on the rod 17, and has a chamfered peripheral portion 21 with teeth 22. A suitable drive means, such as that 23 is provided for rotating the rods 17 in unison to permit transport of the articles 24 (FIG. 2) through the apparatus 10.

The drive means 23 may comprise a drive shaft 25 which is shown supported along the frame wall 14 with mounting blocks 26 which may each contain a bushing 27 through which the shaft 25 extends. Bevel gears 28 are provided along the shaft 25 at spaced apart intervals and at right angles to the gears 20 carried on the rods 17. The shaft gears 28 are in meshed engagement with the rod gears 20 and provide rotation of the rods 17 when the shaft 25 is rotated (generally in the direction of arrow "c", FIG. 1) by any suitable drive means, such as for example, a motor (not shown).

A plurality of transversely spaced-apart wheels or disk members 30 are provided on the rods 17 for engaging at least lower surfaces and preferably along upper surfaces of article 24 and driving the article 24 through the apparatus 10. The disk members 30 are provided to rotate along with the rods 17, and (while not shown) preferably are spaced apart on adjacent rods 17 to form a staggered arrangement, such that the disks 30 are not in a continuous line with respect to the longitudinal direction of the apparatus 10.

The apparatus is provided with guide means 31 which comprise guide members 32 which support and direct articles as they travel through the apparatus 10. The guide members 32 may comprise any suitable elements such as wires or strings and, preferably, must be constructed from a corrosion resistant material, such as for example nylon. Each guide member 32 extends from one end of the apparatus 10 to the other and is mounted at opposite transverse frame wall portions 15 and 16 with tensioning means such as spring members 33. Transverse roll members 34 and 35 are mounted at opposite ends of the apparatus 10, and are furnished with a plurality of annularly disposed grooves 36 on the periphery thereof (with identical roll members 34 and 35 seen in FIG. 2 provided above those shown in FIG. 1).

Figure 2:
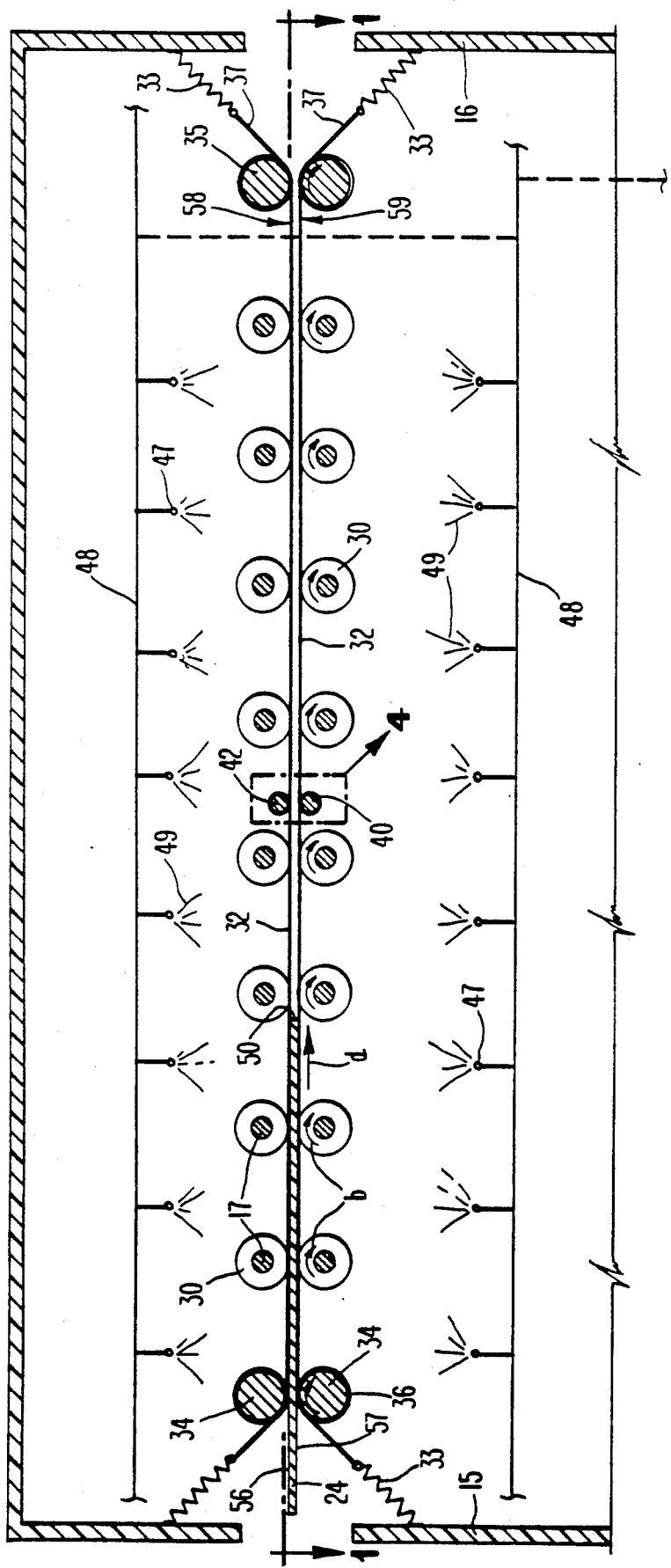
FIG. 2 is a longitudinal sectional view, partially schematic, taken generally along the line 2—2 of FIG. 1, showing an article being transported between upper and lower guide members.

Referring to FIG. 2, the guide wires 32 are shown extending through the roller grooves 36 for a portion of a circular arc, e.g. 45 degrees. It will also be noted that the wires 32 are mounted to the transverse frame walls 15, 16 at a sufficient height or level to provide an angularly extended wire portion, generally 37, which retains the wires 32 in the roller grooves 36.

The guide means 31 also includes wire moving means 38 comprising a lower transverse rod 40 extending through bushings 41 provided in frame walls 13 and 14 (FIG. 3). FIG. 3 shows a second, upper transverse rod 42 extending through a bushing 41 disposed in frame wall 14. Rods 40 and 42 are carried by plate members 43 and 44 to which the rods 40, 42 are fixedly mounted. A cam member 45 is shown in FIG. 3 mounted on the drive shaft 25 to rotate along therewith.

The cam 45 can be elliptically shaped to provide reciprocating movement of the rods 40 and 42 through engagement with the outer plate member 44. When engaged by the cam 45, the plate 44, to which the rods 40 and 42 carrying the guide members 32 are mounted, shifts the guide members 32 from their full line position to their phantom positions in the directions indicated by arrows "a" (FIG. 3). A spring member 46 is provided on the portion of the rod 40 which extends beyond plate 40. The spring 46 provides resistance to urge the plate 42 against the cam 45 as the cam is rotated from its horizontal (phantom) position to its vertical (full line) position.

As the cam 45 rotates to move the guide members 32 back and forth in the direction indicated by double arrows "a", the wires 32 no longer impede fluid coverage of a board 24 to create a longitudinal so-called "shadow" line on the boards 24 which might otherwise result if the wires 32 were to remain stationary.

The guide members 32 are looped around the rods 40 and 42 as shown in FIG. 4. While not shown, it is understood that the rod 40 may be provided with grooves for retaining the guide members 32 in position on the rod 40 as the rod is shifted by the cam 45, or without grooves, friction alone may hold the guides in position on the rods.

A product article 24 (FIG. 2), such as for example, a circuit board or film or other material to be treated, is shown being received at the upstream end of the apparatus 10 by the transport means 11. Fluid treatment, for example, may be administered to an article 24 as it is moved along the transport means 11. Shown in FIG. 2 are a plurality of spray nozzles 47 connected to a common pipe or supply line 48. The nozzles 47, for example, may deliver a chemical etchant to an article 24 passing through the apparatus 10.

The article 24 in FIG. 2 is shown being transported through the apparatus 10 while being supported with the guide members 32 which are provided to parallel opposite surfaces of an article 24 traveling through the apparatus. The leading edge 50 of the article 24 is caused to be received by the next disk member or wheel which it encounters due to the support given the article 24 by the wire member 32. Although a series of guide members 32 are shown in the figures in the immediate areas both above and below the transported article 24 defining a path of travel for articles, it is understood that, depending on the thickness and/or rigidity of the articles being treated, a single series of wire members, such as for example those located below the article 24 (seen in FIG. 1), may be employed with substantial success in many instances.

The present apparatus 10 also may be adjusted to accommodate various size product articles or boards. The second transverse rod 42 of the wire moving means 34 may be adjustably provided to occupy a variety of positions within the slots 52 and 53 which are provided respectively in the plates 43 and 44. This can be achieved by loosening the fastening means, such as the nuts 54 shown in FIG. 3, moving the rod 42 to the desired level, and then tightening the nuts 54 to secure the rod 42 at that level.

Articles such as the board 24 shown in FIG. 2 are first received at one end of the apparatus 10 (the upstream end) and are moved through the apparatus for treatment or processing and are then dispensed from the apparatus for transport to their ultimate destination which may involve additional intervening processing steps. As an article 24 enters the apparatus 10, it is guided by the wire members 32 toward the transport means 11 where it is contacted by the disks 30 which rotate in the direction of arrow "b" to advance the article 24 through the apparatus 10, in the direction indicated by arrow "d."

The article 24 is thereby passed from the disks 30 of one transport rod 17 to those of a next successive transport rod 17. The guide members 32 maintain the alignment of each article 24 by preventing the article's leading edge 50 from slipping below or jamming into the rods 17 or disks 30 carried thereby. As the articles 24 are moved through the apparatus 10 with the transport means, a spray 49 is administered to the upper and lower article surfaces 56 and 57, respectively, from the nozzles 47. The nozzles 47 direct a spray 49 at the article surface to chemically treat the article surfaces 56, 57. This treatment step may comprise etching the articles 24 with an appropriate treatment fluid. As the fluid is administered, however, the guide members 32 which are located between an article surface 56, 57 and the nozzles 47 would appear to block the fluid 49 as it is directed toward the article. The guide members 32 are therefore provided to shift back and forth to allow fluid contact of the areas of the article which would otherwise be shaded by the wire members 32 if allowed to remain stationary. The moving of the guide members 32 in a reciprocating manner is maintained throughout the entire journey of an article 17 traveling through the apparatus.

While the above description and figures reference and disclose an upper series 58 and lower series 59 of transport rods 17 and guide members 32, it shall be understood that depending upon the nature of the articles being processed, either the upper or lower series by itself may be appropriate for moving the articles through the machine 10. Also, while nozzles 47 are shown both above and below the article 24 traveling through the apparatus 10, it will be noted that a single set of nozzles 47 (for example upper or lower) may be employed as well, consistent with the invention described herein.

The orientation of the articles and transport mechanisms, including guide members, while described in relation to a horizontal plane of travel, may be employed with equal success, consistent with the features and benefits herein described, in a variety of alternate orientations, including vertically positioned guides and/or guide members which are provided transverse of the path of article travel. In addition, the guide members while shown used with a fluid treatment operation, may be employed in other processing steps necessary for preparing a circuit board, including, for example, rinsing and drying steps.

It will be further apparent that various changes may be made in the details of construction, as well as in the use and operation thereof, all within the spirit and scope of the invention as recited in the appended claims.

What is claimed is:

1. An apparatus for use in transporting articles to be treated in an etching or other chemical treatment operation to facilitate more uniform treatment of said articles being transported thereby, said apparatus comprising:
   a) a supporting frame;
   b) transport means for defining a generally longitudinal path of travel and moving said articles along said path of travel through said apparatus, said transport means being supported on said frame;
   c) guide means for guiding said articles therewith as the articles are being conveyed through said apparatus by said transport means, said guide means including a series of generally longitudinally disposed elongate members disposed proximate said path of article travel;
   d) elongate member moving means for reciprocatingly laterally shifting the position of said elongate members as said articles are being moved through the apparatus for laterally uncovering different zones along the path of travel; and
   e) treatment delivery means for delivering a treatment of a chemical processing step to said articles, said elongate members being disposed between said article path of travel and said treatment delivery means.

2. The apparatus of claim 1, wherein said elongate member moving means further includes a transversely movable rod member which is movably mounted on the frame for providing reciprocating movement of the elongate members which are attached to said rod member and are moved back and forth along therewith.

3. The apparatus of claim 2, further including a resilient member operably disposed with said transversely movable rod member, wherein said movable rod member is resiliently loaded, with the rod member being adapted to be engaged by a suitable force transmitting member such that said force transmitting member and said resilient member alternatively drive said rod member back and forth.

4. The apparatus of claim 3, wherein said force transmitting member comprises a rotatably driven cam member which engages said movable rod member to provide reciprocating movement thereof.

5. An apparatus for use in transporting articles to be treated in an etching or other chemical treatment operation comprising:
   a) a supporting frame;
   b) transport means for defining a generally longitudinal path of travel and moving said articles along said path of travel through said apparatus, said transport means being supported on said frame;
   c) guide means for guiding said articles therewith as the articles are being conveyed through said apparatus by said transport means, said guide means including a series of generally longitudinally disposed elongate members disposed proximate said path of article travel;
   d) elongate member moving means for reciprocatingly laterally shifting the position of said elongate members as said articles are being moved through the apparatus; and
   e) wherein said transport means includes a series of transverse transport rods rotatably mounted to the frame at each end thereof, each said transport rod being connected to drive means at an end thereof for rotating said transport rods, and a plurality of adjustably spaced-apart disk members which are slidably mounted on each said transport rod to rotate along therewith.

6. The apparatus of claim 5, wherein each said transport rod carries a gear at one end thereof, and wherein said drive means includes rotatably driven shaft member containing gears thereon which engage the gears of the transport rods and rotatably drive said transport rods.

7. The apparatus of claim 6, wherein said shaft member is perpendicularly disposed in relation to said transverse elongate member moving rod, and wherein said elongate member moving means includes a cam member mounted on said shaft member to rotate along therewith.

8. An apparatus for use in transporting articles to be treated in an etching or other chemical treatment operation comprising:
   a) a supporting frame;
   b) transport means for defining a generally longitudinal path of travel and moving said articles along said path of travel through said apparatus, said transport means being supported on said frame;
   c) guide means for guiding said articles therewith as the articles are being conveyed through said apparatus by said transport means, said guide means including a series of generally longitudinally disposed elongate members disposed proximate said path of article travel;
   d) elongate member moving means for reciprocatingly laterally shifting the position of said elongate members as said articles are being moved through the apparatus; and
   e) wherein said guide means are resiliently mounted to said frame at opposite ends of said transport means.

9. The apparatus of claim 8, wherein a roll member having a series of spaced-apart annular grooves in its outer circumferential periphery is provided at each end of the apparatus for receiving an elongate member in each said groove to secure opposite ends of an elongate member thereby.

10. The apparatus of claim 1, wherein said path of travel is generally horizontal.

11. The apparatus of claim 9, wherein said elongate members are wire members.

12. A method of transporting and treating articles with an etching or other chemical treatment operation for facilitating more uniform treatment of said articles being transported thereby, said method comprising the steps of:
   a) moving said articles along a generally longitudinal path of travel through said apparatus with a frame supported transport means, while defining with said transport means, a path of travel;
   b) guiding said articles with guide means as said articles are being moved through said apparatus with said transport means, said guide means including a series of elongate members disposed proximate said path of article travel;
   c) reciprocatingly laterally shifting the position of said elongate members with elongate member moving means as said articles are being moved through the apparatus and laterally uncovering different zones along the path of travel;
   d) delivering a treatment of a chemical processing step to said articles with treatment delivery means as said articles are being moved through said apparatus with said transport means, wherein said elongate members are disposed between said path of article travel and said delivery means.

13. The method of claim 12, wherein the step of shifting the elongate members further includes moving a transversely movable rod member which is movably mounted on the frame to provide reciprocating movement of the elongate members which are attached to said rod member and moving said elongate members back and forth along therewith.

14. The method of claim 13, further including the step of moving said transversely movable rod member relative to a resilient force by engaging said rod member with a force transmitting member which alternatively drives said rod member back and forth.

15. The method of claim 14, wherein the step of transmitting a force to move said transverse rod member back and forth, includes engaging said rod member with a rotatably driven cam member.

16. A method of transporting and treating articles with an etching or other chemical treatment operation comprising the steps of:
   a) moving said articles along a generally longitudinal path of travel through said apparatus with a frame supported transport means, while defining with said transport means, a path of travel;
   b) guiding said articles with guide means as said articles are being moved through said apparatus with said transport means, said guide means including a series of elongate members disposed proximate said path of article travel;
   c) reciprocatingly laterally shifting the position of said elongate members with elongate member moving means as said articles are being moved through the apparatus; and
   d) moving said articles with a transport means further including rotatably driving a series of transverse transport rods with drive means, said transport rods being rotatably mounted to the frame of each end thereof and carrying a plurality of adjustably spaced-apart disk members thereon which are slidably mounted on each said rod to rotate along therewith.

17. The method of claim 16, wherein the step of rotating the transport rods includes rotatably driving a drive shaft having gears disposed thereon which engage gears disposed at an end of each transport rod to rotatingly drive said transport rods.

18. The method of claim 17, wherein said drive shaft has a cam member disposed thereon, the method further including the step of rotatingly driving said cam member with said drive shaft.

19. A method of transporting and treating articles with an etching or other chemical treatment operation comprising the steps of:
   a) moving said articles along a generally longitudinal path of travel through said apparatus with a frame supported transport means, while defining with said transport means, a path of travel;
   b) guiding said articles with guide means as said articles are being moved through said apparatus with said transport means, said guide means including a series of elongate members disposed proximate said path of article travel;
   c) reciprocatingly laterally shifting the position of said elongate members with elongate member moving means as said articles are being moved through the apparatus; and
   d) resiliently maintaining the ends of said elongate members of resilient members.

20. The method of claim 19, wherein the shifting step includes moving each said elongate member back and forth relative to spaced-apart annular grooves in the outer circumferential periphery of roll members which are provided at each end of said apparatus.

21. The method of claim 12, further wherein the step of moving said articles along the transport means occurs along a path of travel which is horizontal of said apparatus.

22. The method of claim 20, wherein said elongate members are disposed longitudinally of said apparatus and are moved transverse of the direction of transport of said articles.

23. The method of claim 21, wherein said elongate members are wire members.

24. The apparatus of claim 1, wherein said treatment delivery means comprise fluid delivery means.

25. The method of claim 12, wherein delivering a treatment includes delivering a fluid to said articles.

* * * * *